(12) United States Patent
Goto

(10) Patent No.: US 10,777,479 B2
(45) Date of Patent: *Sep. 15, 2020

(54) SEMICONDUCTOR MEMORY DEVICE

(71) Applicant: Toshiba Memory Corporation, Minato-ku (JP)

(72) Inventor: Yoshiaki Goto, Nishikasugai-gun (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/236,824

(22) Filed: Dec. 31, 2018

(65) Prior Publication Data

US 2019/0139849 A1 May 9, 2019

Related U.S. Application Data

(63) Continuation of application No. 15/428,801, filed on Feb. 9, 2017, now Pat. No. 10,199,300, which is a (Continued)

(30) Foreign Application Priority Data

Oct. 16, 2007 (JP) .................................. 2007-268775

(51) Int. Cl.
*H01L 23/31* (2006.01)
*H01L 23/495* (2006.01)
(Continued)

(52) U.S. Cl.
CPC ...... *H01L 23/3142* (2013.01); *H01L 23/4951* (2013.01); *H01L 23/4952* (2013.01);
(Continued)

(58) Field of Classification Search
CPC ........... H01L 23/3142; H01L 23/49541; H01L 23/49575; H01L 24/32; H01L 23/49524;
(Continued)

(56) References Cited

U.S. PATENT DOCUMENTS 5,176,366 A 1/1993 Masumoto et al.
5,646,829 A 7/1997 Sota
(Continued)

FOREIGN PATENT DOCUMENTS

JP 6-204390 7/1994
JP 6-224362 8/1994
(Continued)

OTHER PUBLICATIONS

Office Action dated Dec. 27, 2011, in Japanese Patent Application No. 2008-267102 (with English Language Translation).
(Continued)

*Primary Examiner* — Alexander O Williams
(74) *Attorney, Agent, or Firm* — Oblon, McClelland, Maier & Neustadt, L.L.P.

(57) ABSTRACT

A lead frame includes a first outer lead portion and a second outer lead portion which is arranged to oppose to the first outer lead portion with an element-mounting region between them. An inner lead portion has first inner leads connected to the first outer leads and second inner leads connected to the second outer leads. At least either the first or second inner leads are routed in the element-mounting region. An insulation resin is filled in the gaps between the inner leads located on the element-mounting region. A semiconductor device is configured with semiconductor elements mounted on both the top and bottom surfaces of the lead frame.

1 Claim, 14 Drawing Sheets

Related U.S. Application Data continuation of application No. 14/875,287, filed on Oct. 5, 2015, now Pat. No. 9,589,870, which is a continuation of application No. 14/086,253, filed on Nov. 21, 2013, now Pat. No. 9,177,900, which is a continuation of application No. 13/177,257, filed on Jul. 6, 2011, now Pat. No. 8,618,643, which is a continuation of application No. 12/252,584, filed on Oct. 16, 2008, now abandoned.

(51) Int. Cl.
*H01L 23/00* (2006.01)
*H01L 23/498* (2006.01)

(52) U.S. Cl.
CPC .. *H01L 23/49513* (2013.01); *H01L 23/49524* (2013.01); *H01L 23/49541* (2013.01); *H01L 23/49575* (2013.01); *H01L 24/32* (2013.01); *H01L 24/49* (2013.01); *H01L 23/49544* (2013.01); *H01L 23/49555* (2013.01); *H01L 23/49861* (2013.01); *H01L 24/45* (2013.01); *H01L 24/48* (2013.01); *H01L 24/73* (2013.01); *H01L 2224/32057* (2013.01); *H01L 2224/32145* (2013.01); *H01L 2224/32245* (2013.01); *H01L 2224/45144* (2013.01); *H01L 2224/45147* (2013.01); *H01L 2224/48091* (2013.01); *H01L 2224/48145* (2013.01); *H01L 2224/48147* (2013.01); *H01L 2224/48247* (2013.01); *H01L 2224/49* (2013.01); *H01L 2224/73265* (2013.01); *H01L 2224/83385* (2013.01); *H01L 2224/97* (2013.01); *H01L 2225/06562* (2013.01); *H01L 2924/01004* (2013.01); *H01L 2924/01005* (2013.01); *H01L 2924/01006* (2013.01); *H01L 2924/01029* (2013.01); *H01L 2924/01033* (2013.01); *H01L 2924/01057* (2013.01); *H01L 2924/01079* (2013.01); *H01L 2924/01082* (2013.01); *H01L 2924/07802* (2013.01); *H01L 2924/181* (2013.01)

(58) Field of Classification Search
CPC ............ H01L 24/49; H01L 23/4952; H01L 23/49513; H01L 23/49813; H01L 24/45; H01L 23/31; H01L 23/00; H01L 23/495; H01L 23/4951; H01L 23/4924; H01L 23/39524; H01L 23/49861; H01L 23/49544; H01L 23/49555; H01L 34/45; H01L 2224/32057; H01L 2224/32145; H01L 2224/45144; H01L 2224/45147; H01L 2224/48091; H01L 2224/48145; H01L 2224/48147; H01L 2224/48247; H01L 2224/49; H01L 2224/73265; H01L 2224/83385; H01L 2225/06562; H01L 2224/97; H01L 24/48; H01L 2924/07802; H01L 24/73; H01L 2924/181; H01L 2924/01004; H01L 2924/01005; H01L 2924/01029; H01L 2924/91957; H01L 2924/01079; H01L 2924/01082; H01L 2924/02006; H01L 2024/02033; H01L 2924/00014; H01L 2224/33245; H01L 2924/00; H01L 2924/00012; H01L 2924/282; H01L 23/498
USPC ....................................................... 257/676
See application file for complete search history.

(56) References Cited

U.S. PATENT DOCUMENTS

| | | | |
|---|---|---|---|
| 5,780,925 A | 7/1998 | Cipolla et al. | |
| 5,780,926 A | 7/1998 | Seo | |
| 6,399,421 B2 | 6/2002 | Han et al. | |
| 6,433,421 B2 | 8/2002 | Masuda et al. | |
| 6,552,416 B1 | 4/2003 | Foster | |
| 7,102,209 B1 | 9/2006 | Bayan et al. | |
| 7,339,257 B2 | 3/2008 | Ozawa et al. | |
| 8,618,643 B2 | 12/2013 | Goto | |
| 9,177,900 B2 | 11/2015 | Goto | |
| 9,589,870 B2 * | 3/2017 | Goto ................... | H01L 23/4951 |
| 10,199,300 B2 * | 2/2019 | Goto ................... | H01L 23/4951 |
| 2007/0023871 A1 | 2/2007 | Dossi | |
| 2008/0048301 A1 | 2/2008 | Wang et al. | |
| 2017/0154832 A1 * | 6/2017 | Goto ................... | H01L 23/4951 |

FOREIGN PATENT DOCUMENTS

| | | |
|---|---|---|
| JP | 8-148644 | 6/1996 |
| JP | 8-227903 | 9/1996 |
| JP | 9-232508 | 9/1997 |
| JP | 11-121677 | 4/1999 |
| JP | 3082507 | 9/2001 |
| JP | 2003-179194 | 6/2003 |
| JP | 2005-268533 | 9/2005 |
| JP | 2005-340766 | 12/2005 |
| JP | 3813788 | 6/2006 |

OTHER PUBLICATIONS

Office Action dated Dec. 27, 2011, in Japanese Patent Application No. 2011-136497 (with English Language Translation).

* cited by examiner

SEMICONDUCTOR MEMORY DEVICE

CROSS-REFERENCE TO RELATED APPLICATIONS

This application is a continuation of and claims the benefit of priority under 35 U.S.C. § 120 from U.S. Ser. No. 15/428,801, filed Feb. 9, 2017, (now U.S. Pat. No. 10,199, 300) which is a continuation of and claims the benefit of priority under 35 U.S.C. § 120 from U.S. Ser. No. 14/875, 287, filed Oct. 5, 2015, (now U.S. Pat. No. 9,589,870) which is a continuation of and claims the benefit of priority under 35 U.S.C. § 120 from U.S. Ser. No. 14/086,253 filed Nov. 21, 2013 (now U.S. Pat. No. 9,177,900) which is a continuation of and claims the benefit of priority under 35 U.S.C. § 120 from U.S. Ser. No. 13/177,257 filed Jul. 6, 2011, (now U.S. Pat. No. 8,618,643) which is a continuation of and claims the benefit of priority under 35 U.S.C. § 120 from U.S. Ser. No. 12/252,584 filed Oct. 16, 2008, and claims the benefit of priority under 35 U.S.C. § 119 from Japanese Patent Application No. 2007-268775 filed on Oct. 16, 2007; the entire contents of each of which are incorporated herein by reference.

BACKGROUND OF THE INVENTION

1. Field of the Invention

The present invention relates to a semiconductor device and a lead frame used for the same.

2. Description of the Related Art

To realize miniaturization and high-density packaging of the semiconductor device, a semiconductor package having plural semiconductor elements stacked and sealed in one package has already been put into practical use. In a case where priority is given to cost reduction or the like of the semiconductor package, a lead frame is used as a circuit base material where semiconductor elements are mounted. In a semiconductor package (such as TSOP) using a lead frame, plural semiconductor elements are sequentially stacked on the lead frame. The electrode pads of the semiconductor elements are electrically connected with the inner leads of the lead frame through the metal wires.

In a case where the semiconductor elements are mounted on only one side (e.g., back surface) of the lead frame, plural semiconductor elements having a one-side pad structure are stacked in a step-like fashion to electrically connect the inner leads of the lead frame and the electrode pads of the semiconductor elements via metal wires (see JP-A 2001-298150(KOKAI), JP-A 2005-340766(KOKAI)). The inner leads and the electrode pads are connected (wire bonded) on only a region along one side of the semiconductor element. Therefore, there is used a lead frame where the inner leads are at least partly routed via a mounting region of the semiconductor element.

Such a lead frame has plural semiconductor elements stacked on the element-mounting region where at least part of the inner leads are routed. In a case where the semiconductor elements are mounted by stacking on only one side (back surface) of the lead frame, the gaps between the inner leads routed in the element-mounting region are open upward, so that a resin used for sealing enters easily into the gaps between the inner leads. Therefore, the gaps in the inner lead portion corresponding to the element-mounting region do not cause a problem.

The semiconductor package is demanded to increase the number of semiconductor elements. Therefore, it is being studied to mount the semiconductor elements on both the top and bottom surfaces of a lead frame. But, when the semiconductor elements are mounted on both the top and bottom surfaces of the lead frame, the gaps between the inner leads are closed by the top and bottom semiconductor elements to produce an elongate space. It is hard to fill the space with the sealing resin, and the elongate space remains in the semiconductor package. If such a semiconductor package is placed under a high-humidity environment, water content absorbed into the package enters the gaps between the inner leads, and a short circuit might be caused between the inner leads by the water content.

SUMMARY OF THE INVENTION

A semiconductor device according to an aspect of the present invention includes: a circuit substrate provided with an element-mounting region, an outer lead portion having a plurality of outer leads, an inner lead portion having a plurality of inner leads which are at least partly routed in the element-mounting region, and an insulation resin filled into gaps between the inner leads located on at least part of the element-mounting region; a first element group, mounted on the element-mounting region in a first surface of the circuit substrate, including at least one first semiconductor element having electrode pads; a second element group, mounted on the element-mounting region on a second surface in the circuit substrate, including at least one second semiconductor element having electrode pads; first metal wires electrically connecting the electrode pads of the first semiconductor element and the inner leads of the circuit substrate; second metal wires electrically connecting the electrode pads of the second semiconductor element and the inner leads of the circuit substrate; and a resin-sealed portion sealing the first and second element groups together with the first and second metal wires.

A semiconductor device according to another aspect of the present invention includes: a circuit substrate provided with an element-mounting region, an outer lead portion having a plurality of outer leads, an inner lead portion having a plurality of inner leads which are connected to the outer leads and at least partly routed in the element-mounting region, and an insulation resin filled into gaps between the inner leads located on the element-mounting region; a first element group, mounted on the element-mounting region in a first surface of the circuit substrate, including a plurality of first semiconductor elements having electrode pads; a second element group, mounted on the element-mounting region in a second surface of the circuit substrate, including a plurality of second semiconductor elements having electrode pads; first metal wires electrically connecting the electrode pads of the first semiconductor element and the inner leads of the circuit substrate; second metal wires electrically connecting the electrode pads of the second semiconductor element and the inner leads of the circuit substrate; and a resin-sealed portion sealing the first and second element groups together with the first and second metal wires.

A lead frame according to an aspect of the present invention includes: an element-mounting region; an outer lead portion having a plurality of outer leads; an inner lead portion having a plurality of inner leads, at least part of the inner leads being routed in the element-mounting region;

and an insulation resin filled into gaps between the inner leads located on at least part of the element-mounting region.

DETAILED DESCRIPTION OF THE INVENTION

Modes of conducting the present invention will be described below with reference to the drawings.

Figure 1:
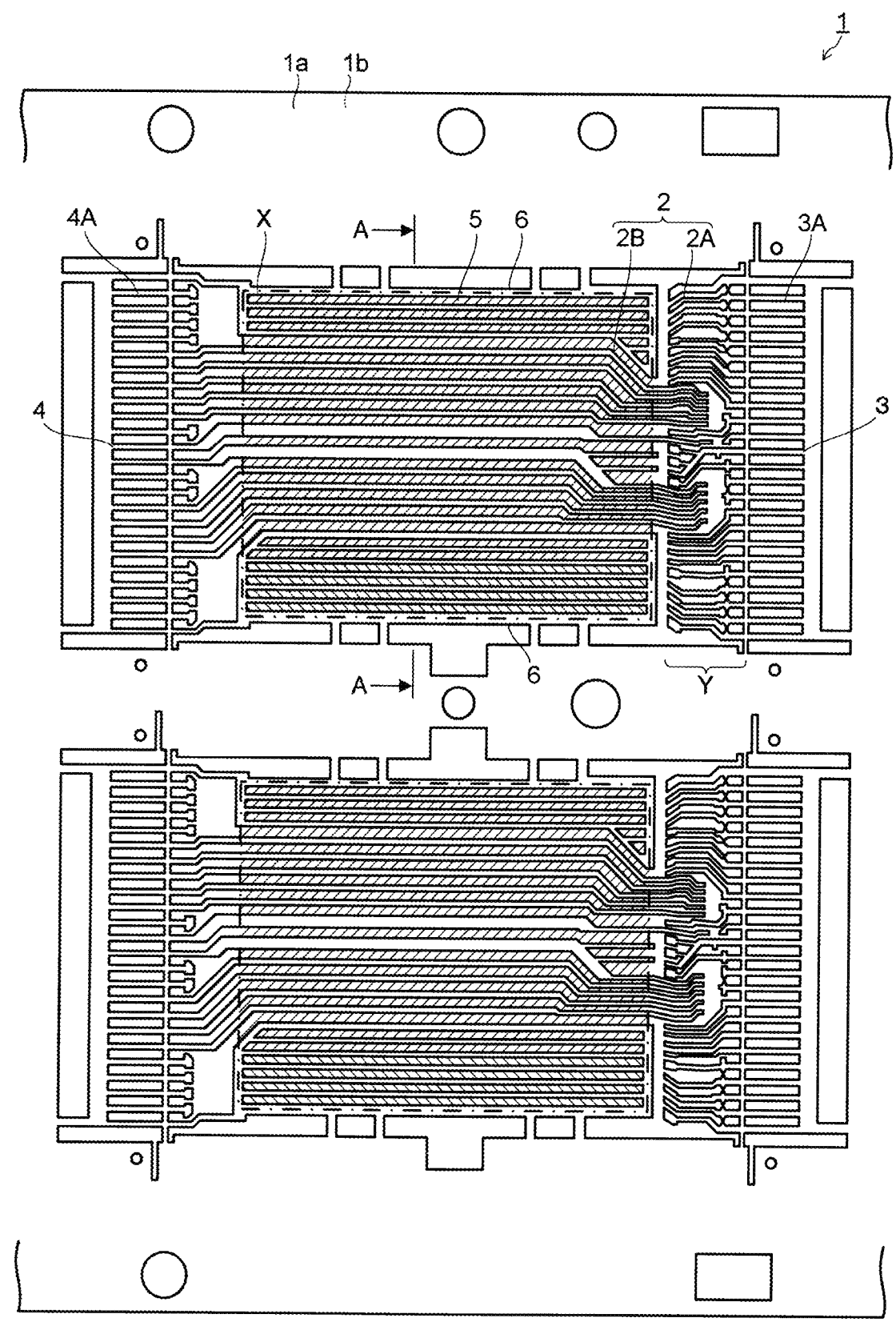
FIG. 1 is a plan view showing a lead frame according to a first embodiment of the present invention.
Figure 2:
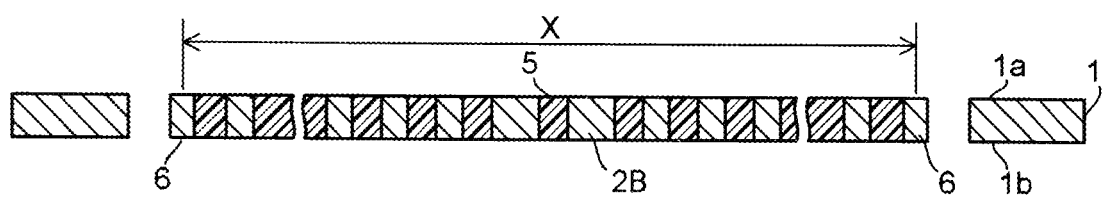
FIG. 2 is a diagram showing an example of a cross section taken along line A-A of FIG. 1.
Figure 3:
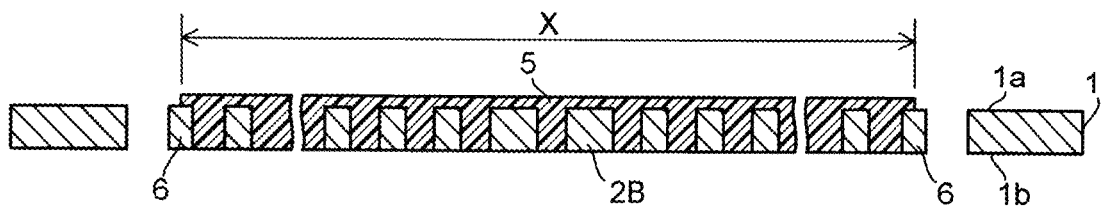
FIG. 3 is a diagram showing another example of the cross section taken along line A-A of FIG. 1.
Figure 4:
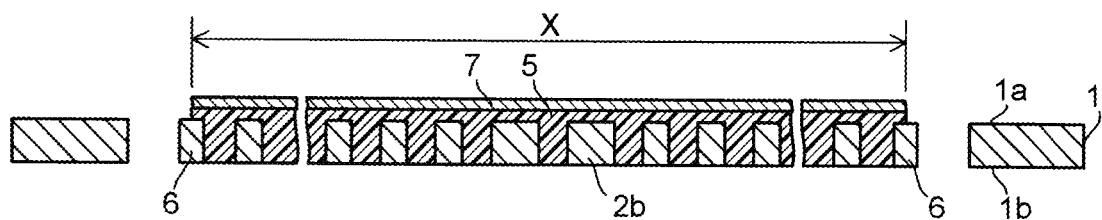
FIG. 4 is a diagram showing still another example of the cross section taken along line A-A of FIG. 1.

The lead frame according to a first embodiment of the present invention is described with reference to FIG. 1 through FIG. 4. FIG. 1 is a plan view showing a structure of the lead frame according to the first embodiment. FIG. 2 through FIG. 4 are sectional views taken along line A-A of FIG. 1. The lead frame 1 shown in these drawings is provided with an inner lead portion 2 which becomes a connection portion to the semiconductor element mounted on it, and first and second outer lead portions 3, 4 which become external connection terminals.

The first outer lead portion 3 has plural outer leads (first outer leads) 3A. Similarly, the second outer lead portion 4 has plural outer leads (second outer leads) 4A. The inner lead portion 2 has plural first inner leads 2A connected to the first outer leads 3A, and plural second inner leads 2B connected to the second outer leads 4A.

The lead frame 1 has a first surface 1a which is its top surface and a second surface 1b which is its bottom surface. A rectangular element-mounting region X is set on the first and second surfaces 1a, 1b of the lead frame 1. The lead frame 1 is a lead frame for dual-side mounting to mount semiconductor elements on both the top and bottom surfaces 1a, 1b. At least one semiconductor element is mounted on each of the first and second surfaces 1a, 1b of the lead frame 1.

For example, plural semiconductor elements having a one-side pad structure are stacked with pad arrangement sides directed in the same direction on the first surface 1a of the lead frame 1. For example, plural semiconductor elements having a one-side pad structure are stacked with pad arrangement sides directed to the same direction on the second surface 1b of the lead frame 1. The pad arrangement sides of the semiconductor elements mounted on the first surface 1a and the semiconductor elements mounted on the second surface 1b are aligned in the same direction.

The first outer lead portion 3 is arranged along one short side of the element-mounting region X. The second outer lead portion 4 is arranged along the other short side of the element-mounting region X. The first outer lead portion 3 and the second outer lead portion 4 are arranged to oppose to each other with the element-mounting region X between them. The first and second outer lead portions 3, 4 are arranged such that the outer leads 3A, 4A are protruded from both the short sides of an element sealing portion of the semiconductor device (semiconductor package) configured by using the lead frame 1.

Since the semiconductor elements are mounted with the pad arrangement sides directed to the same direction, a connection region Y of the inner lead portion 2 to the semiconductor elements is arranged along one short side of the element-mounting region X on the first and second surfaces 1a, 1b of the lead frame 1. FIG. 1 shows the lead frame 1 that the connection region Y of the inner lead portion 2 to the semiconductor elements is set on the side of the first outer lead portion 3. Since the first inner leads 2A are arranged on the side of the first outer lead portion 3, their one ends can be connected to the first outer leads 3A, while the other ends can be arranged in the connection region Y to the semiconductor elements.

It is necessary that the second inner leads 2B have their one ends connected to the second outer leads 4A, and the other ends arranged in the connection region Y on the side of the first outer lead portion 3 which is arranged to oppose to the second outer lead portion 4 with the element-mounting region X between them. Therefore, the second inner leads 2B are extended from the one ends connected to the second outer leads 4A to the other ends arranged in the connection region Y set on the side of the first outer lead portion 3. The second inner leads 2B are routed from the second outer lead portion 4 to the side of the first outer lead portion 3 via the element mounting region X.

Application of the inner lead portion 2 having the first and second inner leads 2A, 2B enables to mount the semiconductor element having a single-short-side pad structure with the pad arrangement sides aligned on both the top and bottom surfaces 1*a*, 1*b* of the lead frame 1. But, since the second inner leads 2B are routed from the second outer lead portion 4 to the side of the first outer lead portion 3, they are partially sandwiched between the semiconductor elements mounted on both the top and bottom surfaces 1*a*, 1*b* of the lead frame 1. Gaps of the second inner leads 2B cannot be filled sufficiently with a sealing resin only.

Accordingly, the gaps in a part of the second inner leads 2B located on the element-mounting region X are filled with an insulation resin 5 as shown in FIG. 2. The insulation resin 5 is filled in the gaps of the inner leads 2B independent of the resin configuring the resin-sealed portion of the semiconductor device (semiconductor package). Either thermosetting resin or thermoplastic resin may be used for the insulation resin 5. A resin having high fluidity at the time of heating, such as epoxy resin or acrylic resin, is preferably used for the insulation resin 5. It is adequate if the insulation resin 5 is filled in the gaps in at least part of the second inner leads 2B located on the element-mounting region X.

It is preferable that a ratio of gaps within the element-mounting region X is kept constant as much as possible for uniform filling of the insulation resin 5 into the gaps of the second inner leads 2B. Since portions 6 other than the second inner leads 2B in the element-mounting region X function simply as an element supporting portion, they may have originally a simple plate shape. For uniformization of the ratio of gaps in the element-mounting region X, similar gaps as those of the second inner leads 2B are also provided for the element supporting portions 6 located at both sides of the second inner lead 2B. The insulation resin 5 is filled in the gaps of the second inner leads 2B located on the element-mounting region X and the gaps of the element supporting portions 6.

Figure 5:
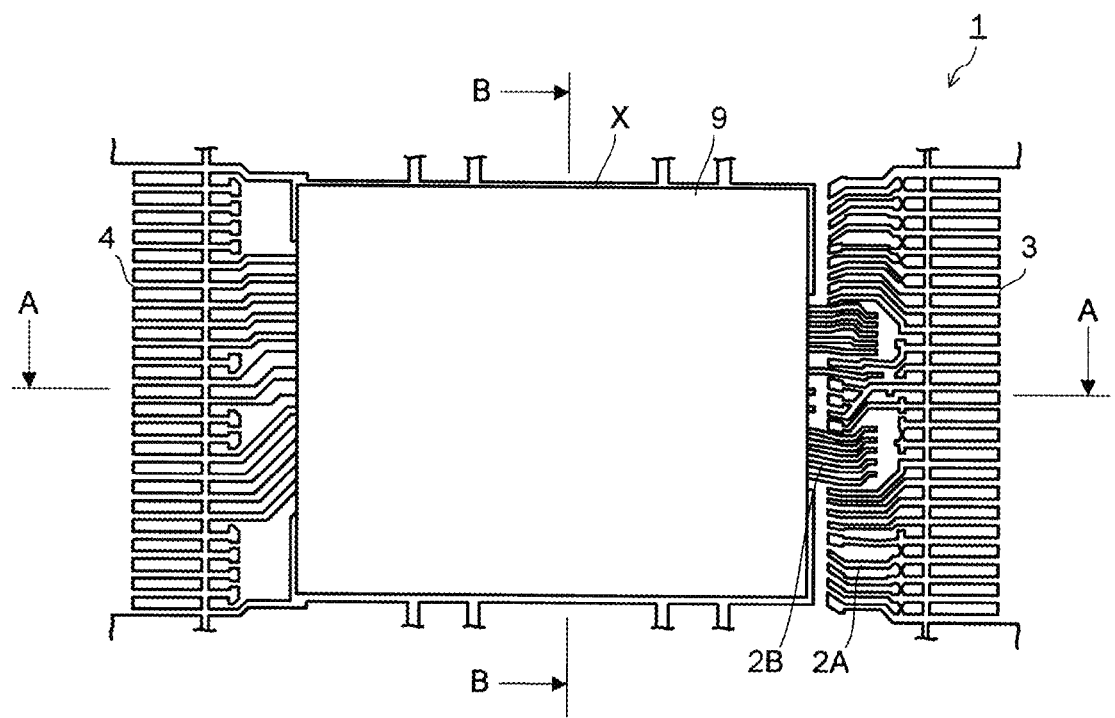
FIG. 5 is a plan view of the lead frame shown in FIG. 4.

The insulation resin 5 is not limited to be filled in the gaps (including the gaps of the element supporting portions 6) of the second inner leads 2B but may be provided in a layer shape on, for example, the top surface 1*a* (or under surface 1*b*) of the lead frame 1 as shown in FIG. 3. An insulation resin sheet having the insulation resin 5 coated on a base film 7 may be used to provide a state that the base film 7 is arranged by compression-bonding on the top surface 1*a* (or under surface 1*b*) of the lead frame 1 while the insulation resin 5 is filled in the gaps of the second inner leads 2B as shown in FIG. 4 and FIG. 5.

Figure 6A:
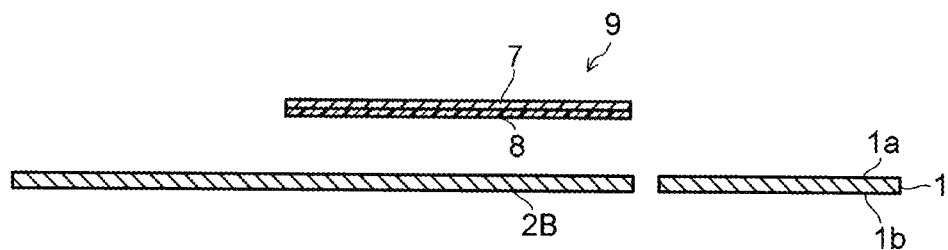
FIG. 6A is a sectional view taken along line A-A of FIG. 5, showing an arranging stage of an insulation resin sheet in the manufacturing process of the lead frame shown in FIG. 4.
Figure 6B:
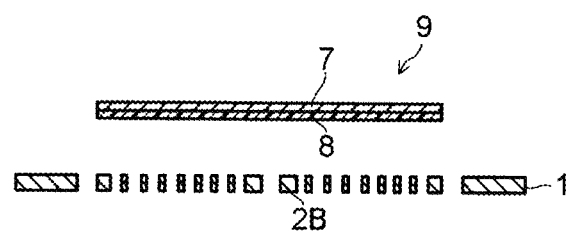
FIG. 6B is a sectional view taken along line B-B of FIG. 5, showing an arranging stage of the insulation resin sheet in the manufacturing process of the lead frame shown in FIG. 4.
Figure 7A:
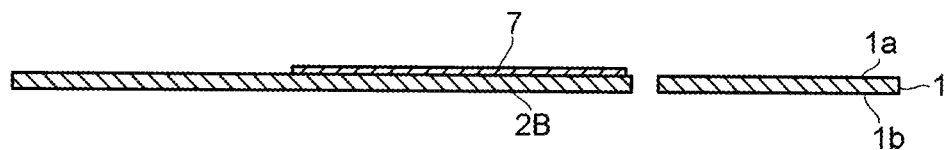
FIG. 7A is a sectional view showing a stage that the insulation resin sheet shown in FIG. 6A is compression-bonded.
Figure 7B:
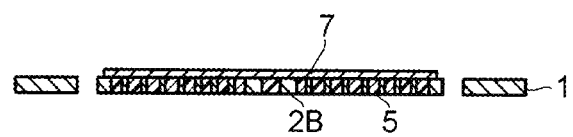
FIG. 7B is a sectional view showing a stage that the insulation resin sheet shown in FIG. 6B is compression-bonded.

A filling process of the insulation resin 5 using the insulation resin sheet is described below with reference to FIG. 5 through FIG. 7. FIG. 6A and FIG. 7A are sectional views taken along line A-A of FIG. 5. FIG. 6B and FIG. 7B are sectional views taken along line B-B of FIG. 5. As shown in FIG. 6A and FIG. 6B, an insulation resin sheet 9 is prepared by forming an insulation resin layer 8 on the support film (base film) 7 having insulating properties by coating an insulation resin composition which becomes the insulation resin 5.

An insulating resin film is used for the support film 7. The insulation resin sheet 9 has the same area as the element-mounting region X. The insulation resin layer 8 is determined to have a thickness considering the volume of the gaps to be filled. As shown in FIG. 7A and FIG. 7B, the insulation resin sheet 9 is bonded by thermocompression bonding to the element-mounting region X from the side of the top surface 1*a* of the lead frame 1, and the insulation resin layer 8 is filled in the gaps (including the gaps of the element supporting portion 6) of the second inner leads 2B. The insulation resin layer 8 is filled in the gaps of the element-mounting region X by provision of fluidity by heating and applying a pressurizing force via the support film 7.

Thus, a state that the insulation resin 5 is filled in the gaps (including the gaps of the element supporting portion 6) of the second inner leads 2B is realized, and the lead frame 1 having the support film (insulation resin film) 7 of the insulation resin sheet 9 used to fill the insulation resin 5 applied to the element-mounting region X can be obtained. Since the support film 7 functions as a deformation preventing member for the second inner leads 2B, it is used in a state pasted to the lead frame 1. The support film 7 may be separated from the second inner leads 2B, if necessary.

For a conventional lead frame, a lead fixing tape is used to prevent the inner leads from deforming. In addition to a filling auxiliary member for the insulation resin 5, the support film 7 can be used as a deformation preventing member for the second inner leads 2B instead of a conventional lead fixing tape. Thus, the wire bonding property to the second inner leads 2B and the handling property of the lead frame 1 can be improved. Besides, since the support film 7 has the same area as that of the element-mounting region X, it does not disturb the mounting of semiconductor elements different from the conventional lead fixing tape which partially covers the inner leads in the element-mounting region.

FIG. 5 through FIG. 7 show a state that the insulation resin sheet 9 is compression-bonded to the top surface 1*a* of the lead frame 1. But the insulation resin sheet 9 may be compression-bonded to the under surface 1*b* of the lead frame 1. Irregularities might be formed between the under surface 1*b* of the lead frame 1 and the insulation resin 5 depending on the distance of the insulation resin 5 entering the gaps of the second inner leads 2B. The irregularities can be smoothened by covering with an adhesive for adhering the semiconductor element to the under surface 1*b* of the lead frame 1. Therefore, there is no possibility of remaining gaps (spaces) after the adhesion of the semiconductor element.

The state that the insulation resin 5 is filled in the gaps between the second inner leads 2B shown in FIG. 2 or the state that insulation resin 5 is filled in the gaps between the second inner leads 2B and also partially formed in a layer shape on the top surface 1*a* of the lead frame 1 shown in FIG. 3 can be realized by thermocompression bonding of the insulation resin film having only the insulation resin formed into the film to the element-mounting region X of the lead frame 1. It is also possible to fill the insulation resin 5 into the gaps between the second inner leads 2B by coating a liquid insulation resin on the element-mounting region X of the lead frame 1. For example, an epoxy thermosetting resin is used as the liquid insulation resin. The liquid insulation resin is coated by a screen printing method or the like, and a pressurizing force is added, if necessary.

Even when the semiconductor elements are mounted on both surfaces (first and second surfaces 1*a*, 1*b*) of the lead frame 1 by filling the insulation resin 5 in the gaps between the second inner leads 2B located on the element-mounting region X, the gaps between the second inner leads 2B do not remain as a space within the package. Therefore, occurrence of a short circuit due to water content, which is absorbed in the package, entering into the gaps between the second inner leads 2B can be suppressed. In other words, a semiconductor device having a dual-side mounting structure excelling in reliability can be provided by using the lead frame 1 of this embodiment.

It was described in the above-described embodiment that the insulation resin 5 for filling the gaps between the inner leads was applied to the lead frame 1 where only the second inner leads 2B were routed via the element-mounting region X. But the shape of the lead frame to which the insulation resin is applied is not limited to what was described above. For example, in a case where semiconductor elements having a single-long-side pad structure are mounted, the connection region to the semiconductor element by the inner lead portion is arranged along one long side of the element-mounting region. In such a case, both the first inner leads connected to the first outer leads and the second inner leads connected to the second outer leads are routed via the element-mounting region. Such a lead frame is shown in FIG. 8.

Figure 8:
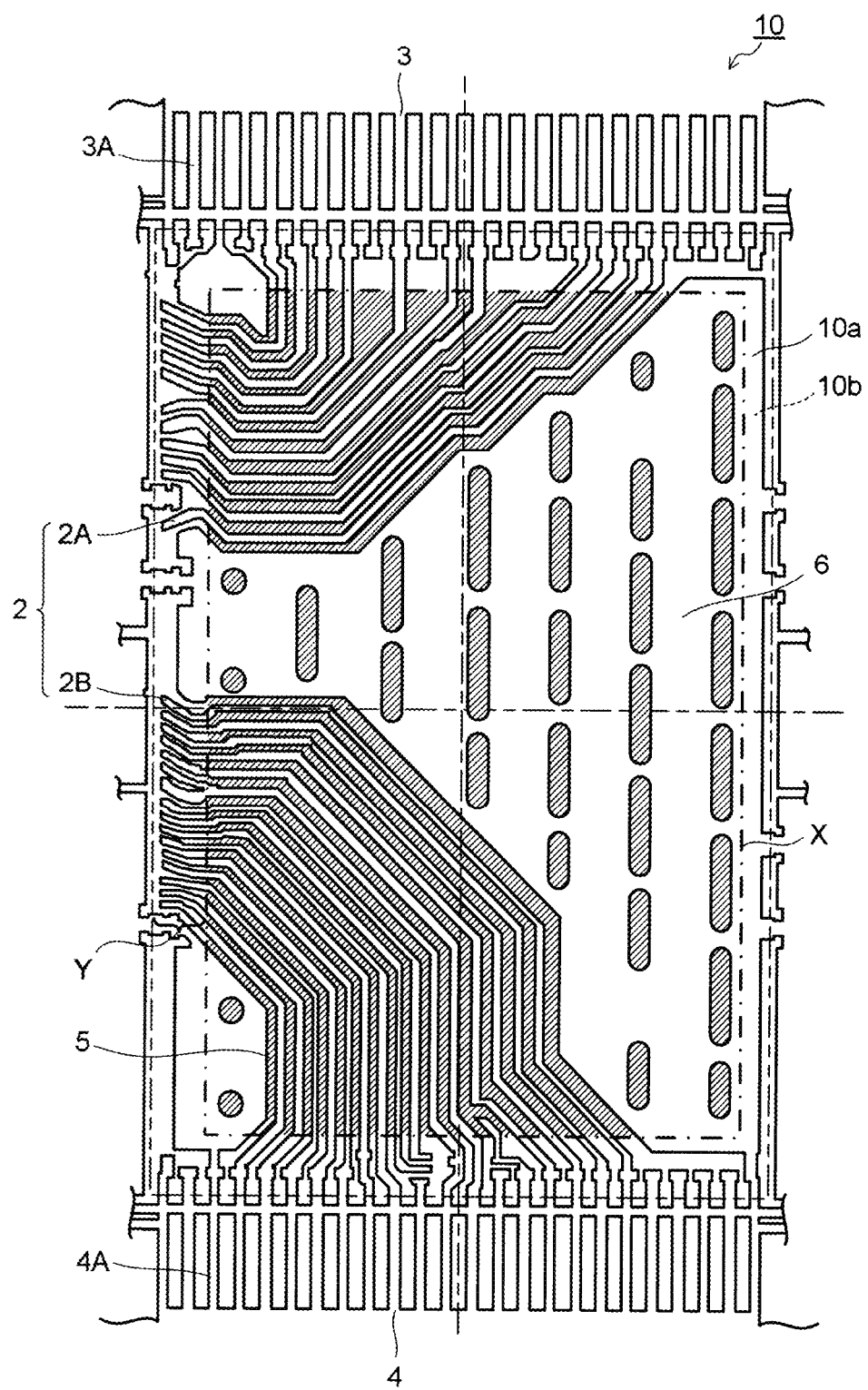
FIG. 8 is a plan view showing a lead frame according to another embodiment of the present invention.

In the lead frame 10 shown in FIG. 8, the first outer lead portion 3 has plural outer leads (first outer leads) 3A. Similarly, the second outer lead portion 4 has plural outer leads (second outer leads) 4A. The inner lead portion 2 has the first inner leads 2A connected to the first outer leads 3A, and the second inner leads 2B connected to the second outer leads 4A.

The first outer lead portion 3 is arranged along one short side (first outline side) of the element-mounting region X. The second outer lead portion 4 is arranged along the other short side (second outline side) of the element-mounting region X. The first outer lead portion 3 and the second outer lead portion 4 are arranged to oppose through the element-mounting region X. The first and second outer lead portions 3, 4 are arranged such that the outer leads 3A, 4A are protruded from both short sides of the element sealing portion of the semiconductor device configured by using the lead frame 10.

At least one semiconductor element having a single-long-side pad structure is mounted in the element-mounting region X by stacking with the pad arrangement side directed to the same direction on first and second surfaces 10a, 10b of the lead frame 10. The connection region Y of the inner lead portion 2 to the semiconductor element is determined on the side of one long side (third outline side) of the element-mounting region X. The first and second inner leads 2A, 2B each have their one end portion connected to the first and second outer leads 3A, 4A with the other end portion arranged in the connection region Y which is set on the side of one long side (third outline side) of the element-mounting region X.

Therefore, the first and second inner leads 2A, 2B each are routed from the connection portion with respect to the first and second outer leads 3A, 4A toward the connection region Y with respect to the semiconductor elements via the element-mounting region X. Specifically, the first inner leads 2A are bent twice in the direction of, for example, 45 degrees such that the direction is changed by 90 degrees from the connection portion with respect to the first outer leads 3A and routed toward the connection region Y with respect to the semiconductor element via the element-mounting region X. Similarly, the second inner leads 2B are routed from the connection portion with respect to the second outer leads 4A toward the connection region Y with respect to the semiconductor elements via the element-mounting region X.

The inner lead portion 2 having the first and second inner leads 2A, 2B can be applied to both the top and bottom surfaces 10a, 10b of the lead frame 10 to mount the semiconductor elements having a single-long-side pad structure by stacking with the pad arrangement sides aligned. But, since the inner leads 2A, 2B are routed from the outer lead portions 3, 4 to the connection region Y with respect to the semiconductor element, they are partly sandwiched between the semiconductor elements mounted on both the top and bottom surfaces 10a, 10b of the lead frame 10.

Accordingly, the insulation resin 5 is filled into the gaps of the first and second inner leads 2A, 2B at a portion located on the element-mounting region X. A specific structure of the insulation resin 5 is as described in the above embodiment. By filling the insulation resin 5 into the gaps of the inner leads 2A, 2B located on the element-mounting region X, the gaps between the inner leads 2A, 2B do not remain as a space in the package even if the semiconductor elements are mounted on both surfaces (first and second surfaces 10a, 10b) of the lead frame 10. Therefore, occurrence of a short circuit due to the water content absorbed into the package can be suppressed.

The insulation resin 5 filling the gaps between the inner leads is effective on the lead frames 1, 10 where at least either the first inner leads 2A connected to the first outer leads 3A or the second inner leads 2B connected to the second outer leads 4A are routed via the element-mounting region X. The first outer lead portion 3 and the second outer lead portion 4 are arranged to oppose to each other via the element-mounting region X. The first inner leads 2A are connected to the first outer leads 3A which configure the first outer lead portion 3, and the second inner leads 2B are connected to the second outer leads 4A which configure the second outer lead portion 4.

The insulation resin 5 is filled into the gaps of the whole inner leads located on the element-mounting region X on the lead frames 1, 10 described above. The filling range of the insulation resin 5 is not limited to the above. For example, when the semiconductor elements mounted on both the top and bottom surfaces of the lead frame have a different size, the insulation resin 5 may be filled into the gaps of the inner leads positioned on the area where the semiconductor elements mounted on the top surface and the semiconductor elements mounted on the under surface are overlapped. The insulation resin 5 is charged to fill the gaps of the inner leads located on at least part of the element-mounting region in addition to the element-mounting region as a whole.

In addition to the lead frames 1, 10, the insulation resin for filling the gaps of the inner leads can also be applied to the lead frame having the inner lead portion where at least part of the plural inner leads is routed in the element-mounting region X. The insulation resin is effective when at least part of the inner leads is routed in the element-mounting region X. Therefore, the semiconductor element mounted on the lead frame is not limited to the single-short-side pad structure or the single-long-side pad structure. The semiconductor elements having various types of pad structures such as a both-side pad structure, an L-shaped pad structure and the like can be mounted depending on a shape of the lead frame.

Figure 9:
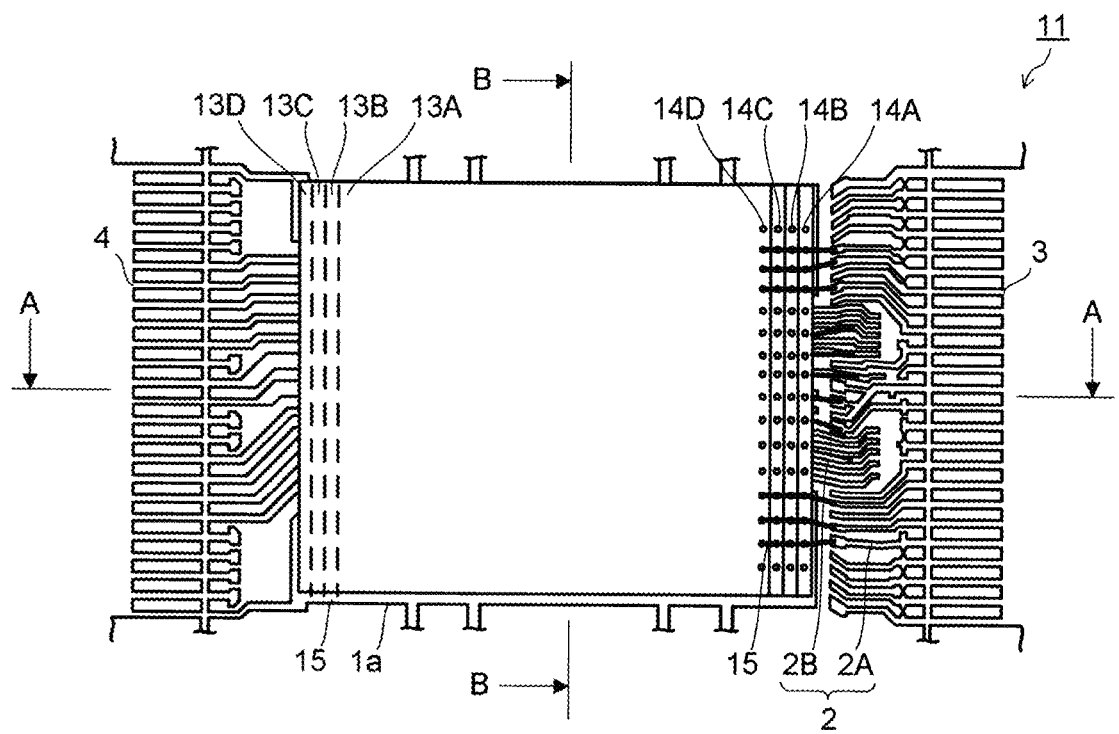
FIG. 9 is a plan view showing a semiconductor device according to the first embodiment of the present invention.
Figure 10:
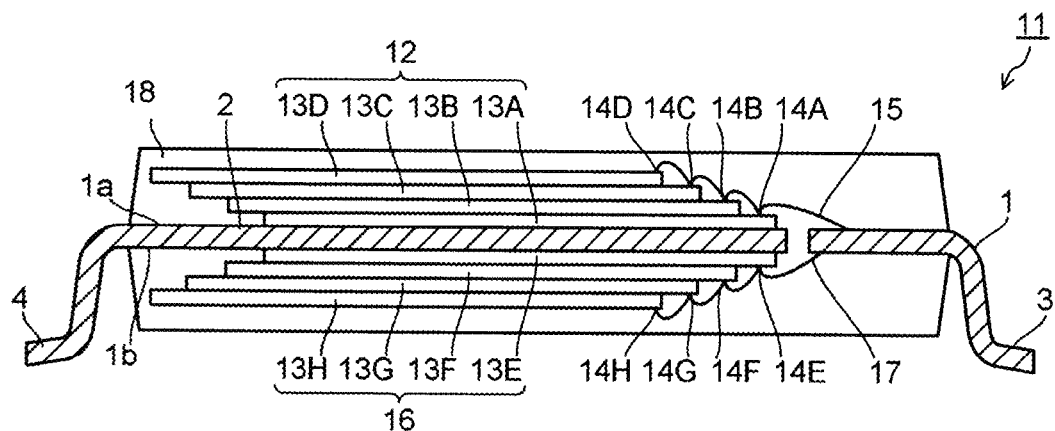
FIG. 10 is a diagram showing a cross section taken along line A-A of FIG. 9.
Figure 11:
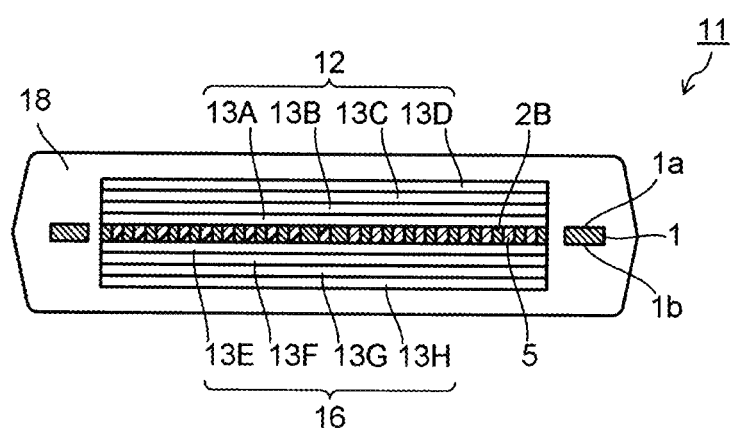
FIG. 11 is a diagram showing a cross section taken along line B-B of FIG. 9.

An embodiment of a semiconductor device of the present invention is described below with reference to FIG. 9 through FIG. 11. FIG. 9 is a plan view showing a semiconductor device (semiconductor package) according to the first embodiment. FIG. 10 is a sectional view taken along line A-A of FIG. 9, and FIG. 11 is a sectional view taken along line B-B of FIG. 9. A semiconductor device 11 shown in these drawings is provided with the lead frame 1 of the above-described embodiment as a circuit base material for mounting elements. The resin-sealed portion is omitted in FIG. 9.

A first semiconductor element 13A, a second semiconductor element 13B, a third semiconductor element 13C and a fourth semiconductor element 13D which configure a first element group 12 are sequentially stacked on the first surface (top surface) 1a of the lead frame 1. The first through fourth semiconductor elements 13A to 13D have the same rectangular shape and electrode pads 14A to 14D. The first through fourth electrode pads 14A to 14D are arranged along one side, and specifically along one short side, of the outer shape of each of the first through fourth semiconductor elements 13A to 13D. The first through fourth semiconductor elements 13A to 13D have a single-short-side pad structure.

The first semiconductor element 13A has its electrode formation surface, on which the first electrode pads 14A are formed, directed upward and is adhered onto the element-mounting region X on the top surface 1a of the lead frame 1 via an adhesive layer (not shown). If the support film 7 is pasted to the top surface 1a of the lead frame 1, the first semiconductor element 13A is adhered to the support film 7 via the adhesive layer. For the adhesive layer, a die attach film which is mainly composed of a general polyimide resin, or the like is used. The same adhesive layer is also used for the other semiconductor elements. The first semiconductor element 13A is arranged with a pad arrangement side (one short side) located on the side of the first outer lead portion 3.

The second semiconductor element 13B is adhered onto the first semiconductor element 13A via an adhesive layer (unshown) with the electrode formation surface, on which the second electrode pads 14B are formed, directed upward. Similarly, the third semiconductor element 13C is adhered onto the second semiconductor element 13B, and the fourth semiconductor element 13D is adhered onto the third semiconductor element 13C via the adhesive layer (not shown), respectively. The second through fourth semiconductor elements 13B to 13D are sequentially stacked in a step-like fashion onto the first semiconductor element 13A with the pad arrangement sides directed to the same direction as the first semiconductor element 13A and to expose the electrode pads 14 (the electrode pads 14A of the first semiconductor element 13A for the second semiconductor element 13B) of the lower semiconductor elements 13.

The first through fourth semiconductor elements 13A to 13D are stacked in a step-like fashion with their pad arrangement sides directed to the same direction, the long sides aligned and the short sides displaced in the direction of the long sides to expose the electrode pads 14 of the lower semiconductor elements 13. Therefore, the electrode pads 14A to 14D of the first through fourth semiconductor elements 13A to 13D are located in a state exposed upward on the side of the first outer lead portion 3. The electrode pads 14A to 14D of the first through fourth semiconductor elements 13A to 13D are electrically connected to the first inner leads 2A through first metal wires 15.

When the first through fourth electrode pads 14A to 14D have the same electric properties and signal characteristics, they can be connected sequentially by the first metal wires 15. In other words, the fourth electrode pads 14D and the third electrode pads 14C are connected by the metal wires 15. Similarly, the metal wires 15 are used to connect between the third electrode pads 14C and the second electrode pads 14B and between the second electrode pads 14B and the first electrode pads 14A. Lastly, the first electrode pads 14A and the first inner leads 2A are connected by the metal wires 15. Wire bonding of the individual pads may be conducted independently or they may be connected sequentially by a single metallic wire.

A fifth semiconductor element 13E, a sixth semiconductor element 13F, a seventh semiconductor element 13G and an eighth semiconductor element 13H which configure a second element group 16 are sequentially stacked on the second surface (under surface) 1b of the lead frame 1. The fifth through eighth semiconductor elements 13E to 13H have the same rectangular shape and respectively have electrode pads 14E to 14H. The fifth through eighth electrode pads 14E to 14H are arranged along one sides, and specifically along one short sides, of the contours of the fifth through eighth semiconductor elements 13E to 13H. The fifth through eighth semiconductor elements 13E to 13H have a single-short-side pad structure.

The fifth semiconductor element 13E is adhered with the electrode formation surface, on which the fifth electrode pads 14E are formed, directed downward to the element-mounting region X on the under surface 1b of the lead frame 1 via an adhesive layer (unshown). The fifth semiconductor element 13E is arranged to position the pad arrangement side (one short side) on the side of the first outer lead portion 3. The fifth semiconductor element 13E is arranged on the first semiconductor element 13A with the lead frame 1 between them with the pad arrangement sides directed to the same direction and the electrode formation surfaces directed to the opposite directions (vertically opposite directions).

The sixth semiconductor element 13F is adhered with the electrode formation surface, on which the sixth electrode pads 14F are formed, directed downward to the electrode formation surface of the fifth semiconductor element 13E via an adhesive layer (unshown). Similarly, the seventh semiconductor element 13G is adhered to the electrode formation surface of the sixth semiconductor element 13F, and the eighth semiconductor element 13H is adhered to the electrode formation surface of the seventh semiconductor element 13G via an adhesive layer (unshown). The sixth through eighth semiconductor elements 13F to 13H are sequentially stacked in a step-like fashion on the electrode formation surface of the fifth semiconductor element 13E with the pad arrangement side directed to the same direction as the fifth semiconductor element 13E and the electrode pads 14 of the lower semiconductor elements 13 (the upper semiconductor elements 13 with respect to the stacked direction) exposed.

The fifth through eighth semiconductor elements 13E to 13H are stacked in a step-like fashion with their pad arrangement sides directed to the same direction as the first element group 12, their long sides aligned, and the short sides displaced in the direction of the long sides to expose the electrode pads 14 of the lower semiconductor elements 13. Therefore, the electrode pads 14E to 14H of the fifth through eighth semiconductor elements 13E to 13H are located in a state exposed downward on the side of the first outer lead portion 3. The electrode pads 14E to 14H of the fifth through eighth semiconductor elements 13E to 13H are electrically connected to the second inner leads 2B through second metal wires 17.

When the fifth through eighth electrode pads 14E to 14H have the same electric properties and signal characteristics, they can be connected sequentially by the second metal wires 17. In other words, the eighth electrode pads 14H and the seventh electrode pads 14G are connected by the metal wires 17. Similarly, the metal wires 17 are used to connect between the seventh electrode pads 14G and the sixth electrode pads 14F and between the sixth electrode pads 14F and the fifth electrode pads 14E. Lastly, the fifth electrode pads 14E and the second inner leads 2B are connected by the metal wires 17. Wire bonding of the individual pads may be conducted independently or they may be connected sequentially by a single metallic wire.

Specific examples of the first through eighth semiconductor elements 13A to 13H include a semiconductor memory element such as a NAND-type flash memory. The number of stacked semiconductor elements 13 configuring each of the element groups 12, 16 is not limited to four (eight in total). The semiconductor element 13 is not limited to the NAND-type flash memory only but may be a laminate of the NAND-type flash memory and its controller element. The metal wires 15, 17 are configured of general Au wires or Cu wires. To connect the metal wires 15, 17, it is preferable to apply reverse bonding capable of lowering the loop height.

The first element group 12 mounted on the top surface 1a of the lead frame 1 and the second element group 16 mounted on the under surface 1b are sealed together with the inner lead portion 2 and the metal wires 15, 17 by a resin-sealed portion 18. A general epoxy resin is used for the resin-sealed portion 18. Thus, the semiconductor device 11 having a dual-side stacking structure is configured. The semiconductor device 11 of this embodiment is suitable for a semiconductor memory device which is provided with high capacity by stacking semiconductor memory elements into multiple layers. The number of semiconductor elements mounted on both the top and bottom surfaces 1a, 1b of the lead frame 1 is adequately one or more, and for example one semiconductor element may be mounted on one surface. In the semiconductor device 11, the lead frame 1 is finally cut and constitutes a circuit substrate. The circuit substrate includes the element-mounting region X, the inner lead portion 2, the outer lead portions 3, 4, and the insulation resin 5.

For the semiconductor device 11 of this embodiment, the insulation resin 5 is filled in the gaps between the second inner leads 2B located on the element-mounting region X of the lead frame 1 before sealing with the resin. Therefore, the first and second element groups 12, 16 each are mounted on the element-mounting region X of both the top and bottom surfaces 1a, 1b of the lead frame 1, and even when the element-mounting region X of the lead frame 1 is interposed between the first semiconductor element 13A and the fifth semiconductor element 13E, the gaps between the second inner leads 2B located on the element-mounting region X do not remain as a space in the package.

Thus, since the insulation resin 5 is filled in the gaps between the second inner leads 2B located on the element-mounting region X, occurrence of a short circuit due to entrance of the water content, which is absorbed into the semiconductor device 11, into the gaps between the second inner leads 2B can be suppressed. Therefore, the semiconductor device 11 of this embodiment has the plural semiconductor elements 13 mounted on both the top and bottom surfaces of the lead frame 1 to increase the number of the mounted semiconductor elements 13, and reliability can also be improved. In other words, the semiconductor device 11 having the number of the mounted semiconductor elements 13 increased and reliability improved can be provided.

Since the semiconductor device 11 has the semiconductor elements 13 stacked on both the top and bottom surfaces of the lead frame 1, a package width can be made narrower in comparison with, for example, a semiconductor device which has the same number of semiconductor elements mounted by stacking on only one surface of the lead frame. When the latter semiconductor device has the number of semiconductor elements halved and folded for stacking in order to have the same package width, an intermediate spacer is required, and the package thickness increases as a result. In other words, the semiconductor device 11 can provide downsizing of the package size.

In the above-described embodiment, the plural semiconductor elements are stacked in a step-like fashion on the lead frame 1, but the plural semiconductor elements may be stacked with the pad arrangement sides (one short sides in this embodiment) aligned. In this case, the metal wire ends connected to the semiconductor elements can be buried into the adhesive layer to prevent the metal wires and the upper semiconductor elements from contacting mutually. The semiconductor elements may also be mounted on only one surface of the lead frame 1.

The semiconductor device 11 is not limited to the above-described structure that the semiconductor elements 13 having a single-short-side pad structure are mounted on both the surfaces of the lead frame 1. For example, the lead frame 10 shown in FIG. 8 can be used to configure a semiconductor device which has semiconductor elements having a single-long-side pad structure mounted on both the surfaces. The electrode pads of the semiconductor elements are electrically connected to the inner leads 2A, 2B arranged in the connection region Y through metal wires. The semiconductor device of the embodiment is effective when the used lead frame has thereon at least either the first inner leads or the second inner leads routed via the element-mounting region X.

Figure 12:
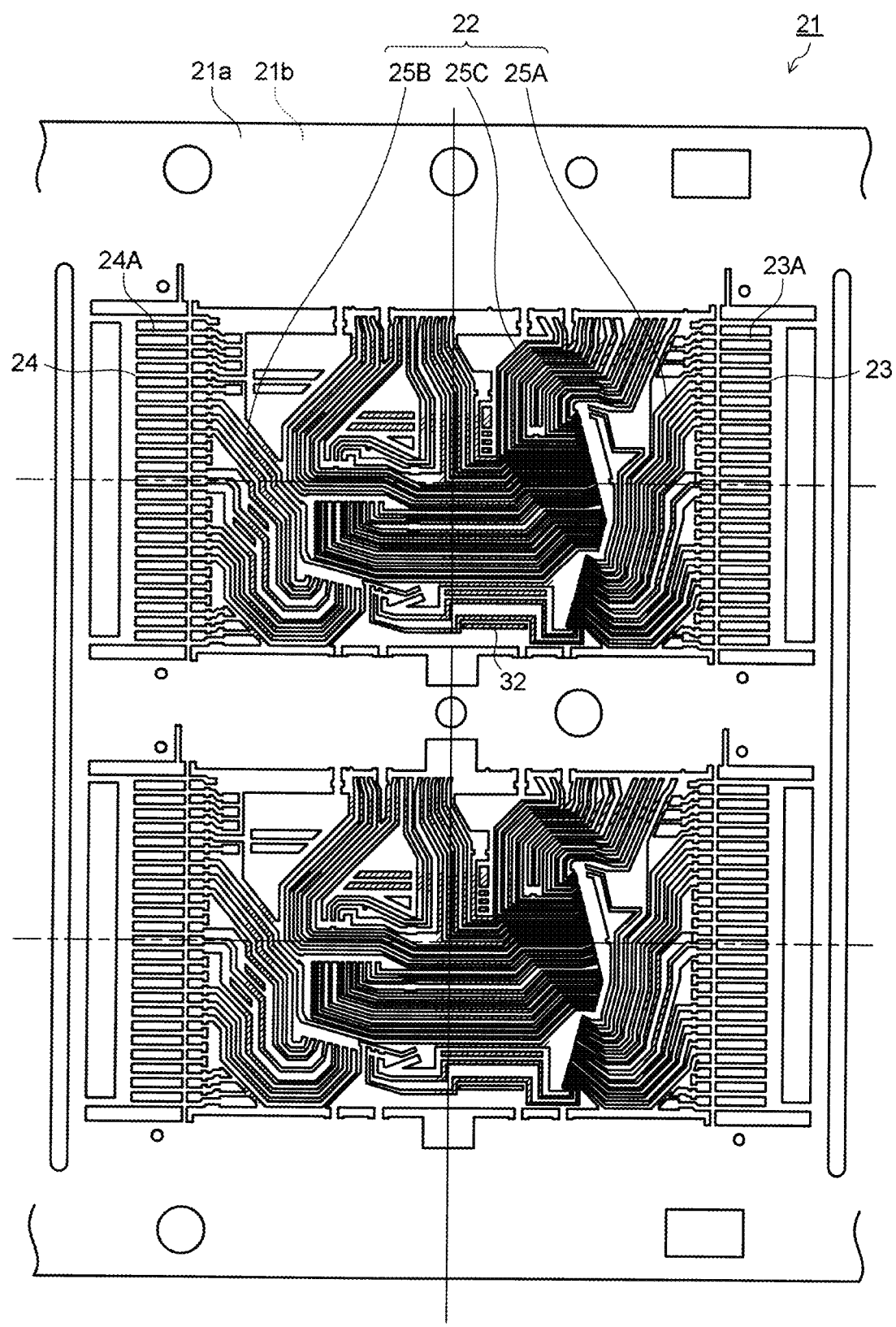
FIG. 12 is a plan view showing a lead frame according to a second embodiment of the present invention.
Figure 13:
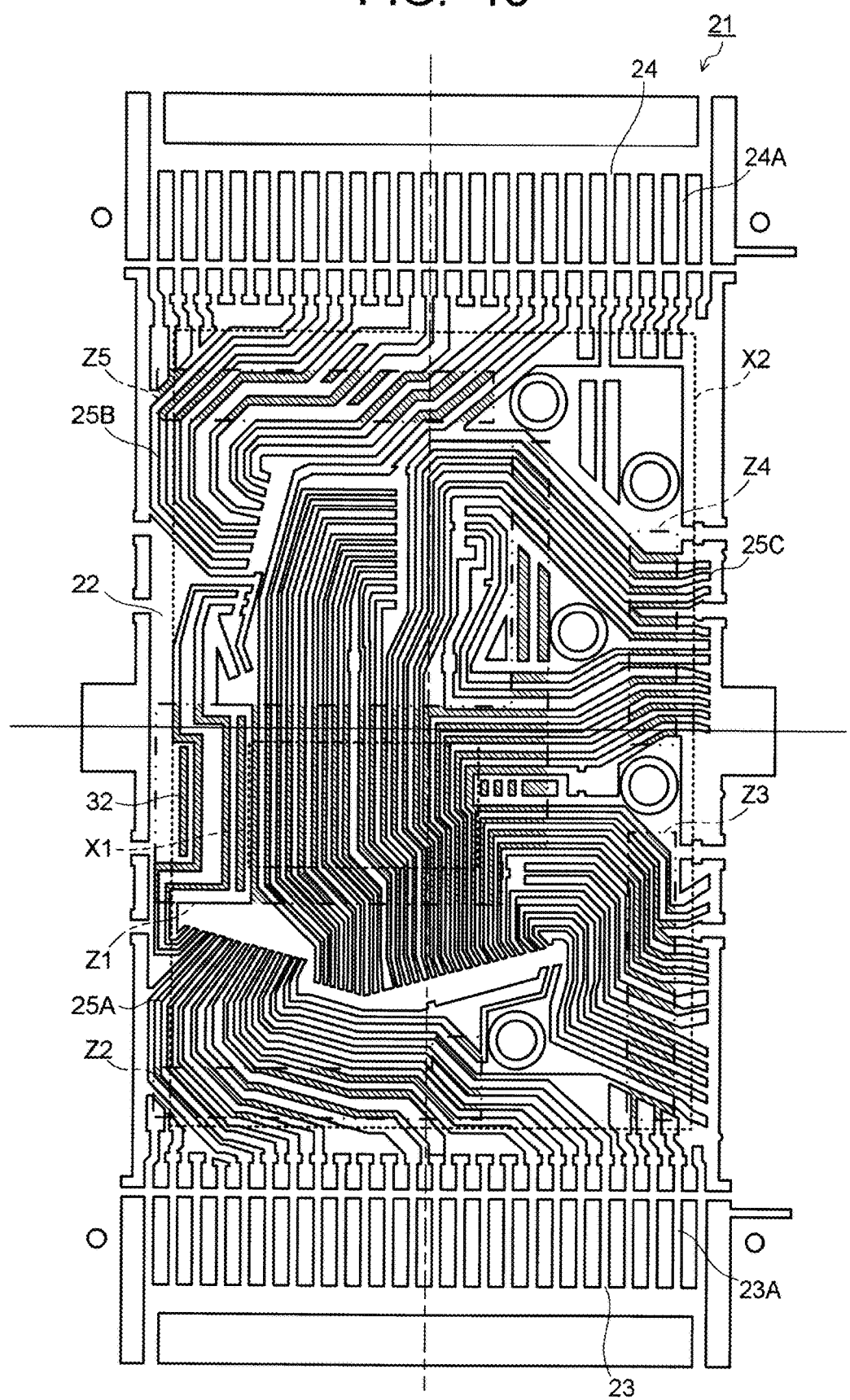
FIG. 13 is a diagram showing a region where gaps between inner leads of the lead frame shown in FIG. 12 are filled with an insulation resin.

A lead frame according to a second embodiment of the present invention and a semiconductor device using it are described below with reference to FIG. 12 through FIG. 17. FIG. 12 and FIG. 13 are plan views showing the lead frame according to the second embodiment. The lead frame 21 shown in these drawings is provided with an inner lead portion 22 which becomes a connection portion to semiconductor elements mounted on the lead frame 21, and first and second outer lead portions 23, 24 which become external connection terminals.

The first outer lead portion 23 has plural outer leads (first outer leads) 23A. Similarly, the second outer lead portion 24 has plural outer leads (second outer leads) 24A. The inner lead portion 22 has first inner leads 25A connected to the first outer leads 23A, second inner leads 25B connected to the second outer leads 24A, and third inner leads 25C which are electrically independent of the first and second outer leads 23A, 24A.

Figure 14:
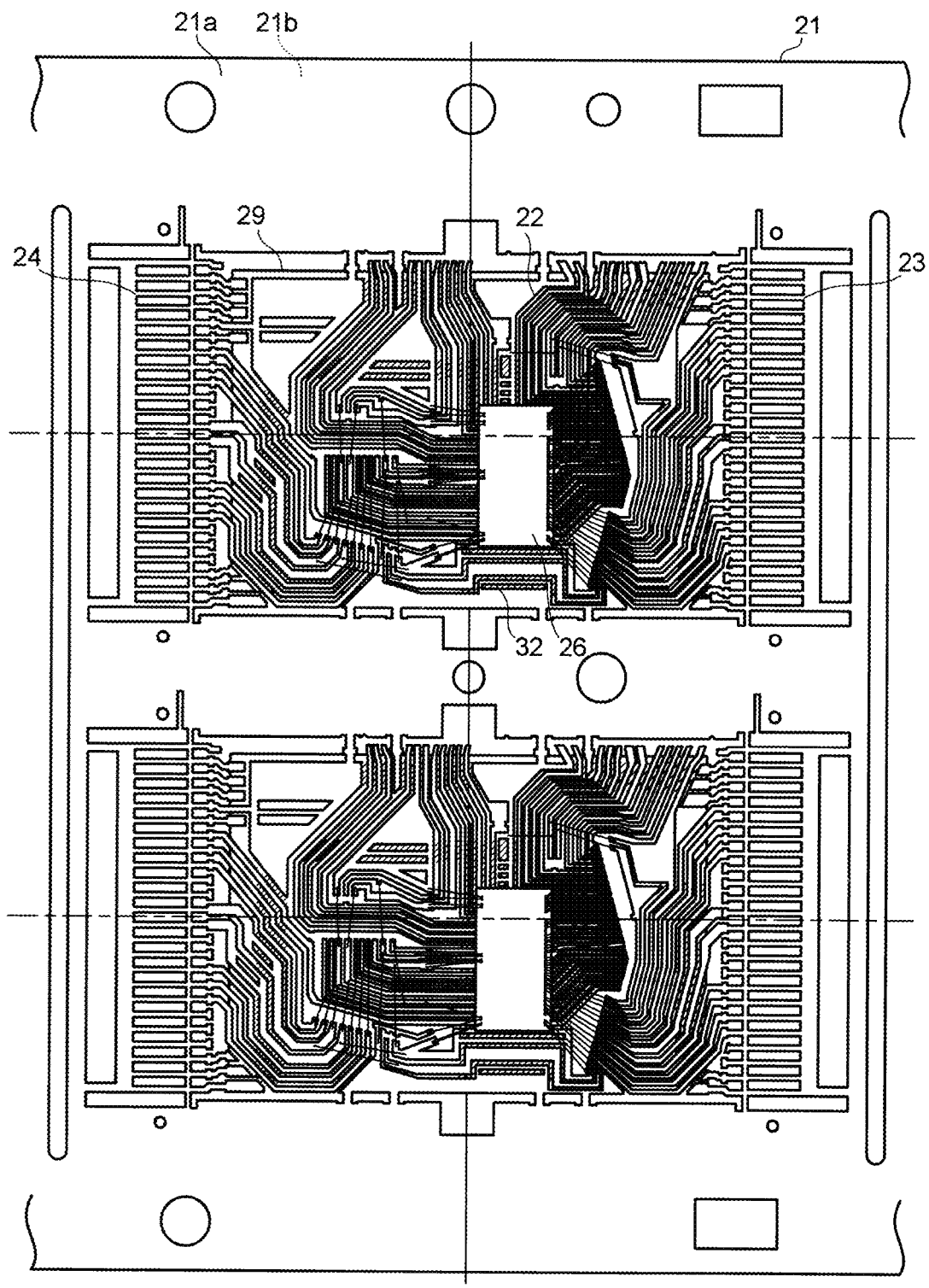
FIG. 14 is a plan view showing a state that a semiconductor element is mounted on the lead frame shown in FIG. 12.
Figure 15:
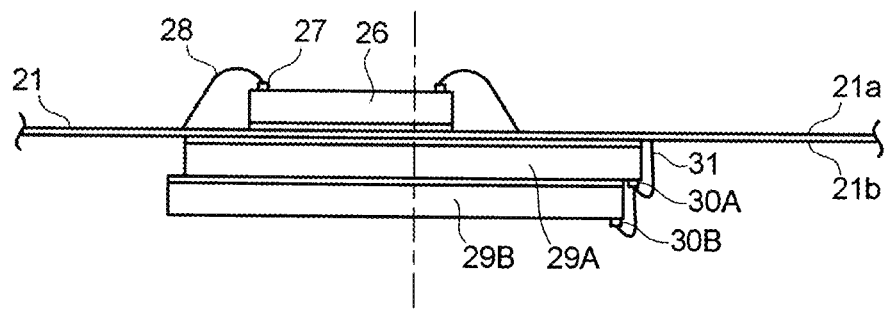
FIG. 15 is a sectional view showing a state that semiconductor elements are mounted on the lead frame shown in FIG. 12.

The lead frame 21 has a first surface (top surface) 21a and a second surface (bottom surface) 21b which is on a side opposite to it. The lead frame 21 is a dual-side mounting lead frame having semiconductor elements mounted on both the top and bottom surfaces 21a, 21b. A first element-mounting region X1 is set on the first surface 21a of the lead frame 21. As shown in FIG. 14 and FIG. 15, a small first semiconductor element 26 is mounted on the first element-mounting region X1 of the lead frame 21. The first element-mounting region X1 has a shape corresponding to the first semiconductor element 26.

The first semiconductor element 26 is adhered to the first element-mounting region X1 in the first surface 21a of the lead frame 21 via an adhesive layer with the electrode formation surface on which electrode pads 27 are formed directed upward. The first semiconductor element 26 configures a first element group. The electrode pads 27 of the first semiconductor element 26 are electrically connected to the inner leads 25 (first, second and third inner leads 25A to 25C) through first metal wires 28.

A second element-mounting region X2 is set on the second surface 21b of the lead frame 21. As shown in FIG. 14 and FIG. 15, a second semiconductor element 29 (29A, 29B) having a shape (outer shape) larger than the first semiconductor element 26 is mounted on the second element-mounting region X2 of the lead frame 21. Two semiconductor elements 29A, 29B are mounted on the second surface 21b of the lead frame 21. The two semiconductor elements 29A, 29B are stacked in a step-like fashion. The second element-mounting region X2 has a shape corresponding to the lower semiconductor element 29A. The second element-mounting region X2 where the first element-mounting region X1 is located inside is determined as an element-mounting region X. Apart of the first element-mounting region X1 may be protruded from the second element-mounting region X2.

The two semiconductor elements 29A, 29B configure a second element group. The lower semiconductor element 29A is adhered to the second element-mounting region X2 of the second surface 21b of the lead frame 21 via an adhesive layer with the electrode formation surface, where electrode pads 30A are formed, directed downward. The semiconductor element 29B is stacked in a step-like fashion on the semiconductor element 29A such that the electrode pads 30A of the semiconductor element 29A are exposed. The electrode pads 30A, 30B of the semiconductor elements 29A, 29B are electrically connected to the inner leads 25 through second metal wires 31.

Specific examples of the second semiconductor elements 29A, 29B include a semiconductor memory element such as a NAND-type flash memory. Specific examples of the first semiconductor element 26 include a controller element of a NAND-type flash memory. The number of stacked semiconductor elements 29 in the second element group is not limited to two but may be three or more. The semiconductor device provided with the semiconductor memory element (second semiconductor element 29) and its controller element (first semiconductor element 26) configures a semiconductor memory device.

The first outer lead portion 23 is arranged along one short side of the element-mounting region X. The second outer lead portion 24 is arranged along the other short side of the element-mounting region X. The first outer lead portion 23 and the second outer lead portion 24 are arranged to oppose to each other with the element-mounting region X between them. The first and second outer lead portions 23, 24 are arranged such that the individual outer leads 23A, 24A are protruded from both short sides of the element sealing portion of the semiconductor device (semiconductor package) configured by using the lead frame 21.

The first, second and third inner leads 25A, 25B, 25C each are routed within the element-mounting region X. Therefore, the inner leads 25 are partly interposed between the first semiconductor element 26 mounted on the first element-mounting region X1 of the lead frame 21 and the second semiconductor element 29A mounted on the second element-mounting region X2. The gaps between the inner leads 25 located on a region (first element-mounting region X1) where the first semiconductor element 26 and the second semiconductor element 29A are overlapped cannot be filled sufficiently by the sealing resin only.

Accordingly, an insulation resin 32 is filled into the gaps between the inner leads 25 located on the first element-mounting region X1. The insulation resin 32 is formed by a different process from the resin which configures the resin-sealed portion of the semiconductor device (semiconductor package). The insulation resin 32 is previously filled into the gaps between the inner leads 25 before the resin-sealed portion is formed. A constituting material and a forming process of the insulation resin 32 are same as those described in the first embodiment. As described in the first embodiment, the support film of the insulation resin sheet for filling the insulation resin may be pasted to the lead frame 21.

It is adequate if the insulation resin 32 is filled in the gaps in a portion located on at least the first element-mounting region X1 of the inner leads 25. In FIG. 13, a filling region Z1 of the insulation resin 32 is set to include the first element-mounting region X1. The insulation resin 32 is filled into the gaps between the inner leads 25 located on the filling region Z1. Besides, the insulation resin 32 has functions to prevent the inner leads 25 from falling and deforming. Therefore, the filling region of the insulation resin 32 can be set in addition to the filling region Z1 including the first element-mounting region X1.

As shown in FIG. 13, the lead frame 21 has second, third, fourth and fifth filling regions Z2, Z3, Z4, Z5 other than the first filling region Z1. The insulation resin 32 is filled into the gaps between the inner leads 25 located on the individual regions Z2 to Z5. Thus, the wire bonding property to the inner leads 25 and the handling property of the lead frame 21 are improved. If there is a possibility of causing falling or the like of the inner leads 25 before the insulation resin 32 is filled, it is preferable that the inner leads of such a portion are mutually connected, and the connected portion is cut after the insulation resin 32 is filled to provide the function of the inner leads 25.

Figure 16:
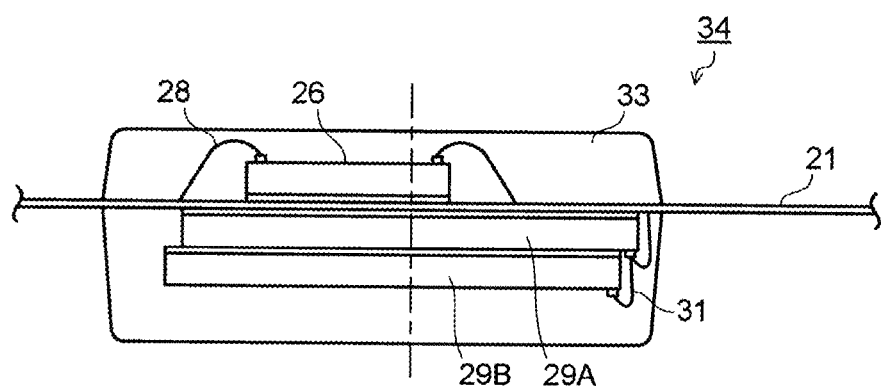
FIG. 16 is a sectional view showing a semiconductor device according to the second embodiment of the present invention.
Figure 17:
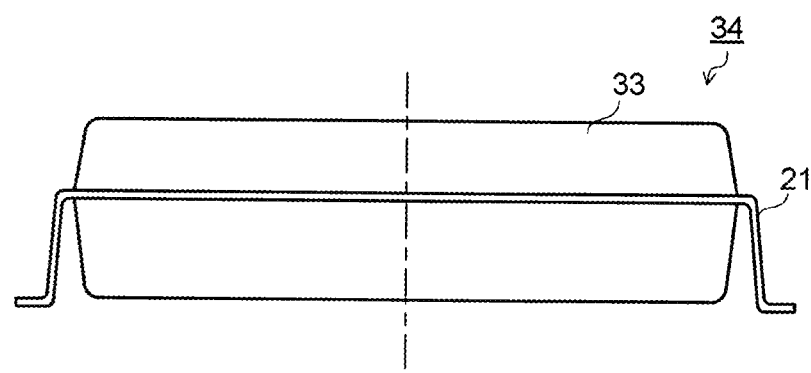
FIG. 17 is a front view of the semiconductor device shown in FIG. 16.

The first and second semiconductor elements 26, 29 mounted on the lead frame 21 are sealed together with the inner lead portion 22 and the metal wires 28, 31 by the resin-sealed portion 33 to configure a semiconductor device 34 having a dual-side mounting structure as shown in FIG. 16 and FIG. 17. In the semiconductor device 34, the lead frame 21 is finally cut and constitutes a circuit substrate. The semiconductor device 34 of the second embodiment has the insulation resin 32 previously filled into the gaps between the inner leads 25. Therefore, even when the element-mounting region X1 of the lead frame 21 is interposed between the first semiconductor element 26 and the second semiconductor element 29A, the gaps between the inner leads located on the element-mounting region X1 do not remain as a space in the package.

As described above, since the insulation resin 32 is filled into the gaps between the inner leads 25 located on the element-mounting region X1, occurrence of a short circuit due to entrance of the water content, which is absorbed into the semiconductor device 34, into the gaps between the inner leads 25 can be suppressed. Therefore, reliability can be improved by the semiconductor device 34 of this embodiment when the semiconductor elements 25, 29 are mounted on both the top and bottom surfaces of the lead frame 21. Besides, the semiconductor device 34 is highly sophisticated and its cost can be reduced by mounting the semiconductor elements 25, 29 on both the top and bottom surfaces of the lead frame 21.

Figure 18:
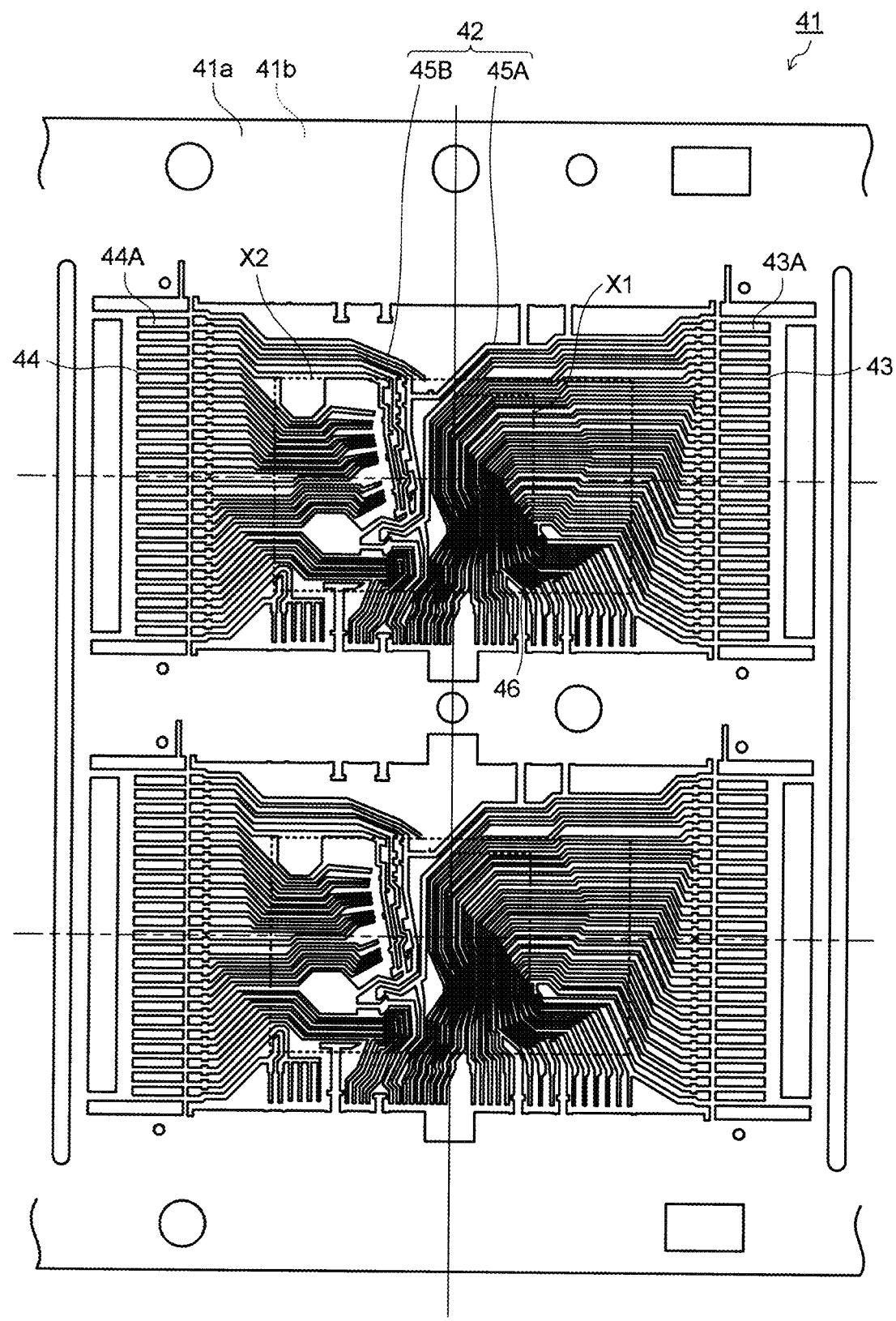
FIG. 18 is a plan view showing a lead frame according to a third embodiment of the present invention.

A lead frame according to a third embodiment of the present invention and a semiconductor device using it are described below with reference to FIG. 18 through FIG. 21. FIG. 18 is a plan view showing the lead frame according to the third embodiment. A lead frame 41 shown in FIG. 18 is provided with an inner lead portion 42 which becomes a connection portion to the semiconductor element mounted on it, and first and second outer lead portions 43, 44 which become external connection terminals.

The first outer lead portion 43 has plural outer leads (first outer leads) 43A. Similarly, the second outer lead portion 44 has plural outer leads (second outer leads) 44A. The inner lead portion 42 has first inner leads 45A connected to the first outer leads 43A and second inner leads 45B connected to the second outer leads 44A.

The lead frame 41 has a first surface (top surface) 41a and a second surface (bottom surface) 41b which is opposite to it. The lead frame 41 is a dual-side mounting lead frame which has semiconductor elements mounted on both the top and bottom surfaces 41a, 41b. Similar to the second embodiment, a first element-mounting region X1 is set on the first surface 41a of the lead frame 41, and a second element-mounting region X2 is set on the second surface 41b. The second element-mounting region X2 where the first element-mounting region X1 is located inside is determined as an element-mounting region X.

Figure 19:
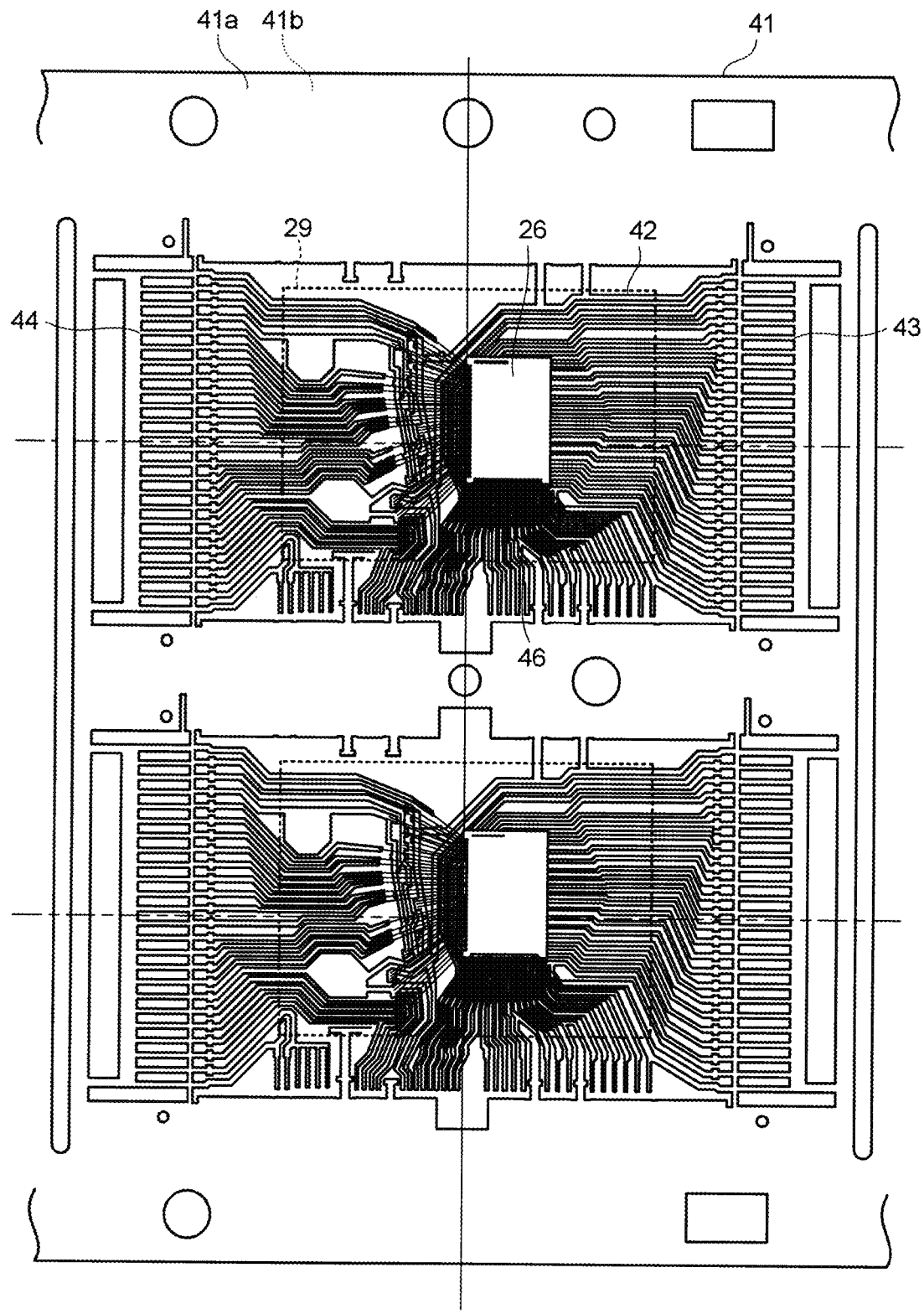
FIG. 19 is a plan view showing a state that a semiconductor element is mounted on the lead frame shown in FIG. 18.
Figure 20:
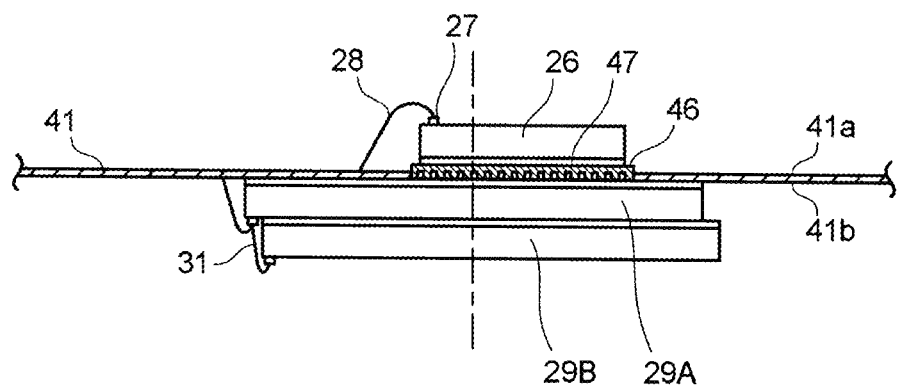
FIG. 20 is a sectional view showing a state that semiconductor elements are mounted on the lead frame shown in FIG. 18.

As shown in FIG. 19 and FIG. 20, a first semiconductor element 26 is mounted on the first element-mounting region X1 of the lead frame 41, and a second semiconductor element 29(29A, 29B) having a shape (outer shape) larger than the first semiconductor element 26 is mounted on the second element-mounting region X2. Two semiconductor elements 29A, 29B are stacked in a step-like fashion on the second element-mounting region X2. The first semiconductor element 26 configures a first element group, and the second semiconductor elements 29A, 29B configure a second element group. The mounting structure and connection structure of the first and second semiconductor elements 26, 29 with respect to the lead frame 41 are similar to those in the second embodiment.

The first outer lead portion 43 is arranged along one short side of the element-mounting region X. The second outer lead portion 44 is arranged along the other short side of the element-mounting region X. The first outer lead portion 43 and the second outer lead portion 44 are arranged to oppose to each other with the element-mounting region X between them. The first and second outer lead portions 43, 44 are arranged such that the outer leads 43A, 44A are protruded from both short sides of an element sealing portion of the semiconductor device (semiconductor package) configured by using the lead frame 41.

The first and second inner leads 45A, 45B each are routed within the element-mounting region X. Therefore, inner leads 45 are partly (specifically, parts of the first inner leads 45A) interposed between the first semiconductor element 26 mounted on the first element-mounting region X1 and the second semiconductor element 29A mounted on the second element-mounting region X2. The gaps between the inner leads 45 located on the region (first element-mounting region X1) where the first semiconductor element 26 and the second semiconductor element 29A are overlapped cannot be filled sufficiently with the sealing resin only.

Therefore, an insulation resin 46 is previously filled into the gaps between the inner leads 25 located on the first element-mounting region X1. In the third embodiment, the adhesive resin (insulation resin) of the first semiconductor element 26 is used to fill the gaps between the inner leads 45 with the insulation resin 46. In other words, the insulating adhesive paste (insulation resin paste having the adhesion properties) is coated onto the first element-mounting region X1 of the lead frame 41. The first semiconductor element 26 is adhered by pressing onto the adhesive paste-coated layer. Thus, the adhesive paste enters the gaps between the inner leads 25. As a result, the gaps between the inner leads 25 are filled with the insulation resin 46.

The adhesive paste which functions as the adhesive layer for the first semiconductor element 26 and as the insulation resin 46 is coated considering a filling amount into the gaps between the inner leads 45. If the coating amount of the adhesive paste is insufficient, the first semiconductor element 26 might be contacted to the lead frame 41. An insulating layer 47 is formed on the back surface (adhered surface) of the first semiconductor element 26 in order to prevent the contact to the lead frame 41 if the coating amount of the adhesive paste is insufficient. The insulating layer 47 is formed by pasting an insulating film to the back surface of the first semiconductor element 26.

Figure 21:
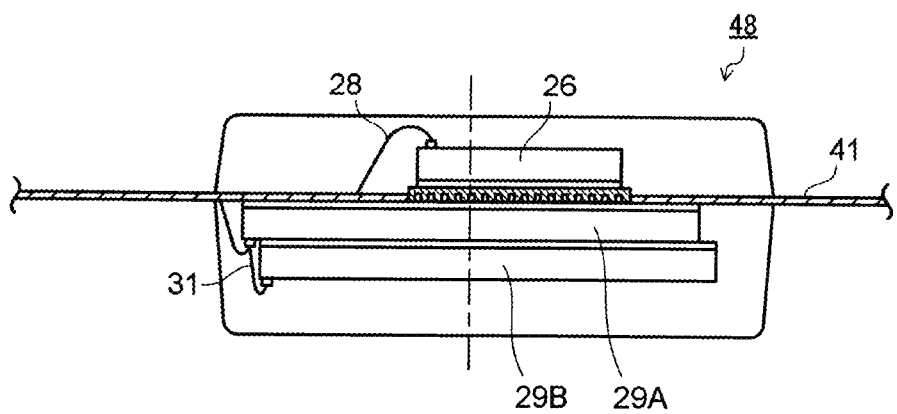
FIG. 21 is a sectional view showing a semiconductor device according to the third embodiment of the present invention.

As shown in FIG. 21, the first and second semiconductor elements 26, 29 mounted on the lead frame 41 are sealed together with the inner lead portion 42 and the metal wires 28, 31 by the resin-sealed portion 33 to configure a semiconductor device 48 having a dual-side mounting structure. In the semiconductor device 48, the lead frame 41 is finally cut and constitutes a circuit substrate. Sealing by the resin is performed after the semiconductor device 48 has the insulation resin 46 filled into the gaps between the inner leads 45. Therefore, even when the element-mounting region X1 of the lead frame 41 is interposed between the first semiconductor element 26 and the second semiconductor element 29A, the gaps between the inner leads 45 located on the element-mounting region X1 do not remain as a space within the package.

As described above, since the insulation resin 46 is filled into the gaps between the inner leads 45 located on the element-mounting region X1, occurrence of a short circuit due to entrance of the water content, which is absorbed into the semiconductor device 48, into the gaps between the inner leads 45 can be suppressed. Therefore, reliability can be improved by the semiconductor device 48 of this embodiment even when the semiconductor elements 26, 29 are mounted on both the top and bottom surfaces of the lead frame 41. Besides, the semiconductor device 48 is highly sophisticated and its cost can be reduced by mounting the semiconductor elements 26, 29 on both the top and bottom surfaces of the lead frame 41.

The present invention is not limited to the above-described embodiments, but can be applied to a lead frame which has semiconductor elements mounted on its both front and rear surfaces and a semiconductor device having a dual-side mounting structure using it. Such a lead frame and a semiconductor device are also included in the present invention. The embodiments of the present invention can be expanded or modified within the scope of technical idea of the invention, and the expanded and modified embodiments are also included in the technical scope of the invention.

What is claimed is:

1. A semiconductor memory device, comprising:
    an element-mounting region;
    a semiconductor memory element mounted on the element-mounting region via an adhesive layer, the semiconductor memory element including an element surface and a pad on the element surface;
    a metal wire;
    a sealing region sealing the semiconductor memory element, the adhesive layer, and the metal wire with resin, the sealing region including first and second long edge sides and first and second short edge sides when the semiconductor memory element is projected from the element-mounting region;

an element-supporting portion supporting the semiconductor memory element;

at least two hanging elements provided at the first long edge side of the sealing region, one end of the hanging elements being connected to the element-supporting portion, and a second end of the hanging elements being exposed to a first lateral face of the resin containing the first long edge sides of the sealing region;

an outer lead portion including first outer leads arranged at the first short edge side of the sealing region and second outer leads arranged at the second short edge side of the sealing region; and an inner lead portion including a plurality of inner leads, at least a part of the inner leads being routed in the element-mounting region, and one end of at least one of the inner leads being arranged at the second long edge side of the sealing region, wherein the pad and the one end of at least one of the inner leads are connected through the metal wire, wherein at least a part of the element-supporting portion is in the element-mounting region, wherein the inner leads include first inner leads and second inner leads, wherein each of the first inner leads includes at least a first portion, a second portion, and a third portion, the first portion extending to the one end of at least one of the inner leads, the second portion extending to the first outer leads, and the third portion routing in the element-mounting region to extend in a direction which intersects the first and second portions, wherein each of the second inner leads includes at least a fourth portion, a fifth portion, and a sixth portion, the fourth portion extending to the one end of at least one of the inner leads, the fifth portion extending to the second outer leads, and the sixth portion routing in the element-mounting region to extend in a direction which intersects the fourth and fifth portions, and wherein at least a part of the element-supporting portion is provided in a region between the third portion and the sixth portion.

* * * * *